(12) United States Patent  (10) Patent No.: US 8,364,098 B2
Ridgers                    (45) Date of Patent: Jan. 29, 2013

(54) PLL CALIBRATION

(75) Inventor: Timothy John Ridgers, Bayeux (FR)

(73) Assignee: ST-Ericsson SA, Plan-les-Ouates (CH)

( * ) Notice: Subject to any disclaimer, the term of this patent is extended or adjusted under 35 U.S.C. 154(b) by 362 days.

(21) Appl. No.: 12/771,900

(22) Filed: Apr. 30, 2010

(65) Prior Publication Data

US 2010/0279635 A1    Nov. 4, 2010

Related U.S. Application Data

(63) Continuation-in-part of application No. PCT/EP2008/009355, filed on Oct. 31, 2008.

(30) Foreign Application Priority Data

Nov. 2, 2007 (EP) .................................. 07119902

(51) Int. Cl.
 *H04B 1/04* (2006.01)
 *H03C 3/06* (2006.01)
 *H03C 3/09* (2006.01)
(52) U.S. Cl. ......................................... 455/113; 332/127
(58) Field of Classification Search .................. 455/110, 455/113, 114.2; 331/1 R; 332/126, 127, 332/128, 144
See application file for complete search history.

(56) References Cited

U.S. PATENT DOCUMENTS

| 6,049,255 | A | 4/2000 | Hagberg et al. |
| 6,515,553 | B1 | 2/2003 | Filiol et al. |
| 7,015,738 | B1 | 3/2006 | Cao |
| 7,728,690 | B2 * | 6/2010 | Ballantyne .................... 332/128 |
| 2003/0043950 | A1 | 3/2003 | Hansen et al. |
| 2004/0192231 | A1 | 9/2004 | Grewing et al. |
| 2005/0046488 | A1 | 3/2005 | Grewing et al. |

FOREIGN PATENT DOCUMENTS

EP            0 961 412 A1    12/1999

* cited by examiner

*Primary Examiner* — Nguyen Vo
(74) *Attorney, Agent, or Firm* — Potomac Patent Group PLLC

(57) ABSTRACT

A method for applying a modulation signal to a phase locked loop comprises filtering the modulation signal to provide a low frequency component and a high frequency for application to respectively the feedback and feedforward paths of a phase locked loop. The high frequency component is scaled by a gain factor before being applied to the feedforward path. The low frequency component is also scaled by a gain factor and applied to the feedforward path. The energy in a common low frequency range of the modulation signal and of the loop error signal is estimated, and the gain factors are modified dependent on the measured energy.

37 Claims, 4 Drawing Sheets

PLL CALIBRATION

BACKGROUND

1. Technical Field

The disclosure relates to apparatus for, and a method of, applying a modulation signal to a phase locked loop, to a phase locked loop comprising the apparatus, and to equipment comprising the apparatus or phase locked loop. The disclosure has application in, particularly but not exclusively, wireless transmitters, for example in mobile communication transceivers.

2. Description of the Related Art

A well-known architecture used in wireless transmitters, for instance for cellular and connectivity applications, applies phase modulation to a local oscillator within a phase-locked loop (PLL). Such an architecture provides not only synthesis, to enable wireless operation on a given channel frequency, but also provides a modulated signal for transmission. Additional paths, for instance I & Q structures to perform Cartesian modulation are not needed. Furthermore a PLL creates precisely the wanted spectrum without the inherent defects of classical modulator circuits, in which mismatch and non-linearity add image, carrier, and inter-modulation spectral components, contributing to EVM (error vector magnitude) and spectral re-growth.

Despite the obvious inherent advantages of applying phase modulation within the PLL, there are a few difficulties. Firstly the loop presents a narrow-band frequency response. Typically the loop cut-off frequency is made sufficiently low so that the local oscillator close-in noise is cleaned-up, while imposing a replica of the crystal reference oscillator spectrum. The integrated phase noise within the PLL loop bandwidth has to remain small, for instance below 1° rms, since this contributes to the overall wireless link performance in terms of residual transmit phase error and a limitation to receiver bit error rate. For a PLL used in a wireless communication system, typical requirements are a loop bandwidth from 10 to 100 kHz, and a close-in noise floor of −90 dBc around the 2 GHz carrier.

Recent radio systems employ wideband modulation schemes in order to achieve high instantaneous data throughput rates. Hence the spectrum of the modulated signal for transmission is usually much wider than the PLL bandwidth. Modulating signals introduced at the reference input, or in the feedback path, from the variable frequency oscillator to the phase comparator, are subject to a low-pass frequency response. The feedback path is of particular interest, since mathematically it can be shown that changing a prescaler divider modulus introduces a precise variation in output frequency, the loop feedback ensuring correct control of the oscillator behavior. This is the first modulation point within a 2-point modulation loop. It has characteristics of precise gain, but restricted pass band. Even if the loop bandwidth could be widened, by accepting a higher overall phase error coming from the integrated noise floor, loop stability dictates that the cut-off frequency should be an order of magnitude lower than the phase comparison reference frequency. This leads to practical PLL bandwidths below one megahertz. Many communication systems use throughputs that occupy a multiple megahertz wide spectrum.

A second modulation point is the local oscillator control input. In an analog PLL this is the voltage control pin that gets its mean potential from the loop filter integration capacitor. Applying an additional voltage signal allows direct frequency modulation of the oscillator. The PLL however attempts to correct for this disturbance. For signals whose frequency falls within the loop bandwidth the loop will create an amplified error signal which will counteract the disturbance and reduce or nullify its effect. For signal frequencies above the loop bandwidth, the loop gain falls-off, reducing the corrective action to zero. This produces a high-pass transfer function, with a transition frequency equal to the loop bandwidth. It has the complementary frequency transfer function characteristic to that of the first modulation point. The gain (change in output frequency for a given voltage input) is set by the intrinsic oscillator gain. This is typically neither well known nor well controlled, being determined by manufacturing of the capacitors used within an LC tank circuit. Furthermore practical circuits show gains that vary with many parameters—supply voltage, temperature, output frequency, as well as part to part dispersion. Therefore there is a need to calibrate the gain in a continuous fashion, during product operation.

As described above, the 2-points can be used in a complementary fashion to apply an arbitrary frequency modulation to the oscillator controlled within a PLL. A problem remains to align the two path gains so as to achieve an ideal flat frequency response. Analysis of various digital modulation schemes shows only a small gain error tolerance in order to attain the required spectral behavior. This is especially the case for complex modulations characterized by a high bit rate per unit bandwidth, such as orthogonal frequency division multiplexing (OFDM) used in wireless LAN (local area network) systems, for example IEEE 802.11a or IEEE 802.11g.

BRIEF SUMMARY DISCLOSURE

According to a first aspect of the disclosure there is provided an apparatus for applying a modulation signal to a phase locked loop, the phase locked loop having:

a variable frequency oscillator for generating an oscillator signal at an oscillator frequency;

a variable division ratio division means for dividing the oscillator signal using a variable division ratio;

a phase comparison means for generating an error signal indicative of a phase difference between the divided oscillator signal and a reference signal; and a coupling means for applying the error signal to the oscillator for controlling the oscillator frequency;

the apparatus comprising:

modulation filtering means for providing a low frequency component of the modulation signal and a high frequency component of the modulation signal;

scaling means for scaling the low frequency component by a first gain factor and the high frequency component by a second gain factor;

outputs for delivering the low frequency component for controlling the division ratio and the scaled low and scaled high frequency components for controlling the oscillator frequency in combination with the error signal;

energy estimation means for generating an indication of the energy of the modulation signal and the energy of the error signal in a frequency range common to the modulation signal and to the error signal; and gain adjustment means for modifying the first and second gain factors dependent on the indication of the energy.

Thus the disclosure provides for the adjustment of the gain of a high frequency component of a modulation signal injected at the control input of an oscillator in a phase locked loop. The adjustment is based on the measurement of energy in a low frequency component of the modulation signal injected at the same point and on the measurement of energy in the loop error signal, both measurements of energy being performed over a common frequency range. The disclosure is particularly advantageous in enabling the adjustment of gain with a low complexity implementation that does not require the use of a correlator.

According to a second of the disclosure there is provided a method for applying a modulation signal to a phase locked loop, the phase locked loop having:

a variable frequency oscillator for generating an oscillator signal at an oscillator frequency;

a variable division ratio division means for dividing the oscillator signal using a variable division ratio;

a phase comparison means for generating an error signal indicative of a phase difference between the divided oscillator signal and a reference signal; and a coupling means for applying the error signal to the oscillator for controlling the oscillator frequency;

the method comprising:

providing a low and a high frequency component of the modulation signal by filtering the modulation;

scaling the low frequency component by a first gain factor and the high frequency component by a second gain factor;

delivering the low frequency component for controlling the division ratio and the scaled low and scaled high frequency components for controlling the oscillator frequency in combination with the error signal;

generating an indication of the energy of the modulation signal and the energy of the error signal in a frequency range common to the modulation signal and the error signal; and modifying the first and second gain factors dependent on the indication of the energy.

According to a third aspect of the disclosure there is provided a phase locked loop comprising a phase locked loop as specified in the first aspect of the disclosure and an apparatus according to the first aspect of the disclosure.

According to a further aspect of the present disclosure there is provided an integrated circuit comprising the apparatus according to the first aspect of the disclosure.

According to a further aspect of the disclosure there is provided a radio transmitter comprising the phase locked loop according to the third aspect of the disclosure.

According to a further aspect of the disclosure there is provided a computer program adapted to perform the method according to the second aspect of the disclosure. The disclosure also extends to a computer readable medium comprising such a computer program.

A phase locked loop also has a low-pass loop filtering means for filtering the error signal, and optionally the energy estimation means may be adapted to generate the indication of the energy of the error signal in the common frequency range from the filtered error signal. Furthermore the common frequency range may correspond to the bandwidth of the loop filtering means. These features can remove or reduce the need for additional filtering of the error signal for the purpose of energy estimation.

Optionally the energy estimation means may be adapted to generate the indication of the energy of the modulation signal in the common frequency range from the low frequency component of the modulation signal or from the scaled low frequency component of the modulation signal. This can remove or reduce the need for additional filtering of the modulation signal for the purpose of energy estimation.

Optionally the indication of energy may comprise an indication of the energy in the common frequency range of the modulation signal and an indication of the energy in the common frequency range of the error signal. Thus the energy of both signals may be estimated independently, enabling a low complexity implementation of the estimation. Alternatively the indication of energy may comprise an indication of the ratio of the energy of the modulation signal in the common frequency range and the energy of the error signal in the common frequency range. Thus the ratio of these signals may be formed first, followed by estimation of the energy of the ratio, enabling a single stage of energy estimation to be used and reduced processing by the gain adjustment means.

Optionally the gain adjustment means may be adapted to modify the first and second gain factors by a multiplication factor $$\frac{k}{(1-k)}\frac{E_E}{E_L},$$

where $E_E$ represents the estimated energy of the common frequency range of the error signal, $E_L$ represents the estimated energy of the common frequency range of the modulation signal, $$k = \frac{G_L}{G_H}$$

where $G_L$ is the first gain factor and $G_H$ is the second gain factor, and k<1.

Optionally, $E_E$ and $E_L$ may be representative of the respective energies at the control input of the oscillator. This can enable high accuracy by ensuring that the common frequency range of the error signal and of the modulation signal experience the same gain in the loop.

Optionally, the second gain factor may be $2^n$ times the first gain factor, where n is a positive integer. In this case division or multiplication by k can be implemented merely by one or more right or left shifts of a binary value in a register.

Optionally, the gain adjustment means may be adapted to modify at least one of the first and second gains factors dependent on the type of modulation. In this way, the apparatus may be adapted for different types of modulation signal having respective different spectra.

Optionally the apparatus may comprise DC removal means for removing a DC component from the error signal prior to the energy estimation of the error signal. This removes the need for DC to be taken into account during the energy estimation.

Optionally the phase locked loop may comprise a lock detection means for generating an out-of-lock indication, and the gain adjustment means may be adapted to refrain from modifying the first and second gain factors in response to the out-of-lock indication. This can prevent the gain adjustment means from reacting to transient loop signals while the loop is acquiring lock.

Optionally the phase locked loop may comprise storage means for storing an indication of the first and second gain factors, and the first and second scaling means may be adapted to employ the respective stored values for their scaling. This can enable fast adjustment of the gain factors, which can be advantageous in, for example, a time division multiple access system.

Optionally the phase locked loop may comprise storage means for storing a value of the second gain factor, and the first and second scaling means may be adapted to employ the stored value for their scaling. This can also enable fast adjustment of the gain factors and also has a reduced storage requirement.

Optionally the phase locked loop may comprise storage means for storing a value of the DC component of the error signal and the DC removal means may be adapted to employ the stored value for subsequent DC removal. This can enable fast removal of DC and consequently fast adjustment of the gain factors, which can be advantageous in, for example, a time division multiple access system.

Corresponding optional features apply also to the method according to the disclosure.

BRIEF DESCRIPTION OF THE SEVERAL VIEWS OF THE DRAWINGS

The disclosure will now be described, by way of example only, with reference to the accompanying drawings where.

DETAILED DESCRIPTION

Figure 1:
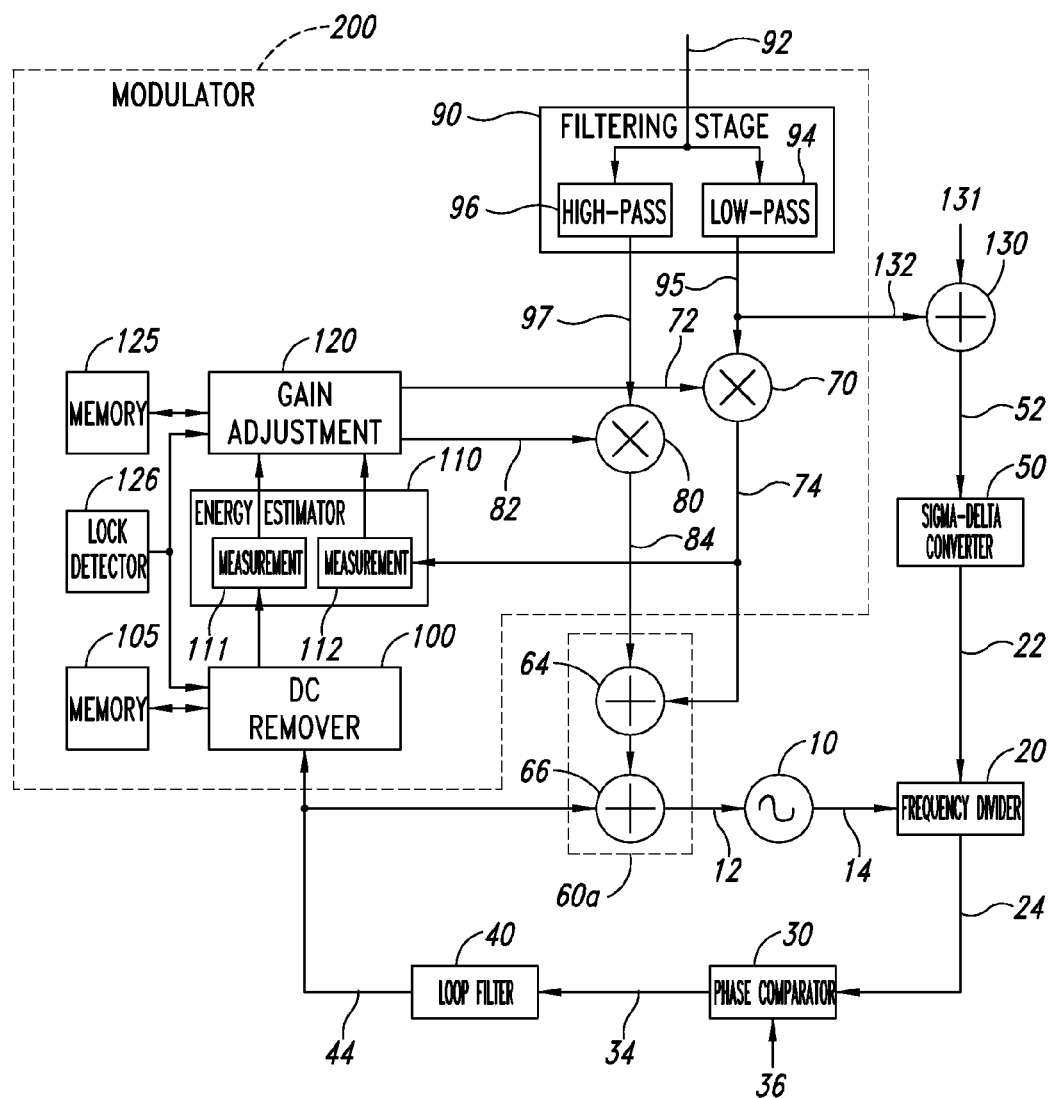
FIG. 1 is a block schematic diagram of an embodiment of a phase locked loop with provision for being modulated.

Referring to FIG. 1, there is illustrated an oscillator 10, such as a voltage controlled oscillator or a digitally controlled oscillator, having a control input 12 for controlling the frequency of the oscillator 10 and an output 14 for an oscillator signal. In a digital controlled oscillator, the frequency of the oscillator signal is controlled by a digital input word. The output 14 is coupled to an input of a divider 20 for dividing the frequency of the oscillator signal. The divider 20 has an output 24 for the divided oscillator signal. The output 24 is coupled to a first input of a phase comparator 30 which also has a second input 36 for a reference signal. The phase comparator 30 performs a comparison of the phase of the divided oscillator signal with the phase of the reference signal and provides on an output 34 an error signal which is an indication of the phase difference between the oscillator signal with the reference signal. The phase comparator 30 may be a time-to-digital converter, such a converter producing a digital word proportional to the difference in time of arrival between edges of two input signals. The output 34 is coupled to an input of a loop filter 40 for low pass filtering the error signal. An output 44 of the loop filter 40 is coupled to the control input 12 for controlling the frequency of the oscillator 10. The elements of FIG. 1 described above form a basic phase locked loop.

The loop can be modulated at two points. First, the divider 20 has a control input 22 for controlling the division ratio of the divider 20. There is an optional summing stage 130 for summing a first modulation component applied at an input 132 with an optional channel selection signal provided at an input 131. The channel selection signal can be used for selecting the center frequency of the oscillator. The output of the summing stage 130 is coupled to an input 52 of a sigma-delta converter 50, and an output of the sigma-delta converter 50 is coupled to the control input 22 of the divider 20 for controlling the division ratio. Second, there is a summing stage 60A for summing the filtered error signal at output 44 with a further modulation component, and an output of the summing stage 60 is coupled to input 12 of the oscillator 10.

The modulation signal may be supplied as a digital word at a rate high enough to correctly code the bandwidth which the modulation signal occupies. Typically for a polar modulation scheme in which amplitude and phase information is processed separately, the bandwidth for the instantaneous frequency information is significantly wider than the resulting output spectrum, once amplitude and phase components are recombined. For instance, for the EDGE mobile communication standard, although the output modulation spectrum is typically ±135 kHz wide, the frequency modulation is coded across at least ±1 MHz of bandwidth, so the clock rate can be say 6.5 MHz.

The following paragraphs describe the apparatus 200 for generating the modulation components.

There is a filtering stage 90 having an input 92 for a modulation signal. The filtering stage comprises a low pass filter 94 and a high pass filter 96 for filtering the modulation signal. The low pass filter provides on an output 95 a low frequency component of the modulation signal having a bandwidth within the loop bandwidth, and the high pass filter 96 provides on an output 97 a high frequency component of the modulation signal having frequencies higher than the loop bandwidth and optionally lower. The output 95 is coupled to the input 132, and so the low frequency component corresponds to the first modulation component described above.

The output 95 is also coupled to an input of a scaling stage 70 which has a further input 72 for a first gain factor. The scaling stage 70 scales the low frequency component by the first gain factor and provides the scaled low frequency component at an output 74 which is coupled to an input of the summing stage 60A.

Figure 2:
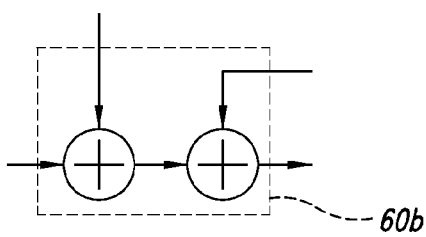
FIG. 2 is a block schematic diagram showing an alternative configuration of a summing stage.

The output 97 is also coupled to an input of a scaling stage 80 which has a further input 82 for a second gain factor. The scaling stage 80 scales the high frequency component by the second gain factor and provides the scaled high frequency component at an output 84 which is coupled to an input of the summing stage 60A. The summing stage 60V sums the scaled low and high frequency components with the filtered error signal. Thus the scaled low and high frequency components together correspond to the further modulation component described above. An alternative summing stage 60B, having a different order of summation is illustrated in FIG. 2, could be employed in place of the summing stage 60A.

The output 44 of the loop filter 40 is coupled to an input of a DC removal stage 100 for removing the DC from the filtered error signal. An output of the DC removal stage 100 is coupled to an input of an energy estimation stage 110. The output 74 of the scaling stage 70 is coupled to an input of the energy estimation stage 110. There is an optional memory unit 105 coupled to the DC removal stage 100 for storing an indication of the DC value, normally only when the loop has achieved lock, for which a lock detection stage 126 may be provided as described below, otherwise a transient signal may be processed as a modulation signal, resulting in erroneous gain factors. The stored DC value may be updated during operation of the loop, for example during transmit or receive by a transceiver. The stored value may be used to assist subsequent DC removal.

The energy estimation stage 110 is adapted to estimate the energy of the filtered error signal after DC removal and of the scaled low frequency component in respective measurement stages 111,112, and the estimates are provided on outputs which are coupled to inputs of a gain adjustment stage 120. The range of frequencies over which the energy is estimated is referred to in this specification as the common frequency range, and it is within the loop bandwidth. The common frequency range used for energy estimation is equal, for both the error signal and the low frequency component of the modulation signal. The common frequency range can have a low-pass characteristic or a band-pass characteristic, although a low-pass characteristic enables simpler filtering.

The measurement stages 111, 112 may comprise respective filters to define the common frequency range, and provide an indication of the average output of each filter as the estimate of energy. In other embodiments, instead of a simple average, the energy may be estimated in other ways, for example as a true rms (root means square) value, the average of a rectified signal, or a weighted combination of a peak value and an average value, the same method being used for both measurement stages 111 and 112.

In another embodiment the energy estimation stage 110 may be adapted to determine the ratio of the error signal and the modulation in the common frequency range, and to then estimate the energy of the ratio. In this case the energy of the ratio may then be provided to the gain adjustment stage 120.

The gain adjustment stage 120 employs the estimates the energy of the scaled low frequency component and of the error signal, or the energy of the ratio of these components, to determine a new value of each of the first and second gain factors. The new value $G_L'$ of the first gain factor $G_L$ may be determined as $$G_L' = G_L \cdot \frac{k}{(1-k)} \frac{E_E}{E_L} \quad (1)$$

and the new value $G_H'$ of the second gain factor $G_H$ may be determined as $$G_H' = G_H \cdot \frac{k}{(1-k)} \frac{E_E}{E_L} \quad (2)$$

where $G_L$ is the current value of the first gain factor, $G_H$ is the current value of the second gain factor, $E_E$ is the estimated energy of the filtered error signal in the common frequency range, $E_L$ is the estimated energy of the scaled low frequency component in the common frequency range, and $$k = \frac{G_1}{G_2} < 1.$$

Thus both gain factors are adjusted by the same proportion, $$\frac{k}{(1-k)} \frac{E_E}{E_L}.$$

This is because both the error signal and the scaled low frequency component delivered to the input 12 of the oscillator 10 are subject to the same loop gain error. The ratio $E_E/E_L$ is the measured energy ratio, and $k/(1-k)$ is the expected energy ratio, any deviation from the expected energy ratio being due to a poorly adjusted value of the gain in the modulation path to the input 12 of the oscillator 10. Therefore the gain error may be represented as $$\frac{k}{(1-k)} \frac{E_E}{E_L}.$$

The first and second gain factors are related by the constant k, and consequently, it is convenient to calculate one gain factor from the other gain factor, e.g., $G_L'=k \cdot G_H'$ or $G_H'=G_L'/k$. The value of k may be chosen arbitrarily, however a value $k=1/2^n$, where n is a positive integer, for example $k=0.5$, can be advantageous because division or multiplication by k can then be implemented as respectively one or more right or a left shifts of a binary value in a register containing the value of $G_H'$ or $G_L'$. The value of k may be selected dependent on the spectrum of the modulation signal. For example, when only a small fraction of the spectrum falls outside of the loop bandwidth it may be preferable to keep k smaller and consequently apply more of the modulation signal to the control input of the oscillator, whereas when most of the spectrum falls inside the loop bandwidth, a larger value of k may be preferable with more of the modulation signal used to control the division ratio. Therefore, if the apparatus is used for more than one type of modulation scheme, the value of k may be varied during operation.

Normally, $0<G_L<1$ and $0<G_H<1$. However, if larger values of $G_L$ or $G_H$ are used, successive adjustments will cause the values to reduce below unity. The gain adjustment stage is coupled to provide the new value $G_L'$ of the first gain factor to the input 72 of the scaling stage 70 and the new value $G_H'$ of the second gain factor to the input 82 of the scaling stage 80.

By repeating the energy estimation and adjustment of the first and second gain factors, the values of the gain factors will converge when $k \cdot E_E = (1-k) \cdot E_L$.

There is an optional memory unit 125 coupled to the gain adjustment stage 120 for storing the new values $G_L'$, $G_H'$ for recall in a subsequent iteration of gain adjustment, at which time they will be used as current values. Alternatively, it is sufficient to store only one of the new values because the other can be calculated as $G_L'=k \cdot G_H'$ or $G_H'=G_L'/k$.

Also, there is an optional lock detection stage 126 coupled to the gain adjustment stage 120. The lock detection stage 126 is adapted to indicate whether the phase locked loop is locked, for example by measuring the amplitude of the error signal before modulation is applied to the loop, and the gain adjustment stage 120 is adapted to refrain from determining a new value of each of the first and second gain factors if the lock detection stage 126 indicates that the loop is not locked.

The operation of the apparatus 200 for generating the modulation components will now be described with reference to FIG. 3. The skilled person in the art will be familiar with the operation of the basic phase locked loop and the use of two point modulation, so these will not described here.

Figure 3:
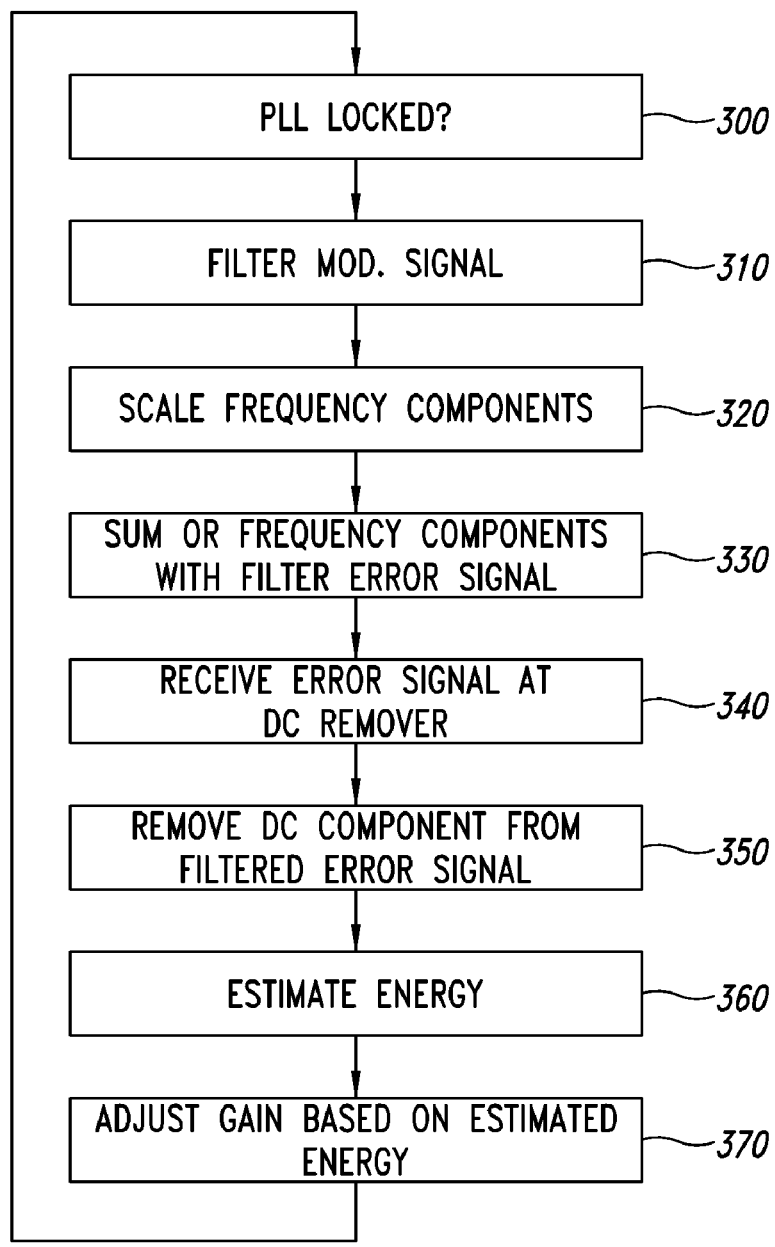
FIG. 3 is a flow chart illustrating a method of modulating a phase locked loop.

Referring to FIG. 3, at step 300 a test is performed by the lock detection stage 126 to determine whether the phase locked loop is locked. If the loop is not locked, flow will not proceed to the next step. Flow will proceed to step 310 only if the loop is locked.

At step 310 a modulation signal is filtered by the filtering stage 90 to provide a low frequency component and a high frequency component of the modulation signal.

At step 320 the low frequency component is scaled by the first gain factor $G_L$ and the high frequency component is scaled by the second gain factor $G_H$. This step may include retrieving one or both of the gain factors from the memory 125.

At step 330 the scaled low and high frequency components are delivered for controlling the frequency of the oscillator 10, by providing the scaled low and high frequency components to the summing stage 60 for summing with the filtered error signal.

At step 340 the filtered error signal is received. At step 350 the DC component of the filtered error signal is removed from the filtered error signal by the DC removal stage 100. This step may include retrieving a previously stored indication of DC value from the memory 105 and employing that to assist the DC removal. This step may also include storing, in memory 105, an indication of the value of the DC component removed for use in subsequent iterations of the method.

At step 360 the energy of the scaled low frequency component and the filtered error signal after DC removal is estimated by the energy estimation stage 110 and an indication of this energy is provided to the gain adjustment stage 120.

At step 370 the indication of energy is employed by the gain adjustment stage 120 to adjust the values of the first and second gain factors, dependent on the indication of energy. This step may include retrieving a previously stored value of either or both of the first and second gain factors from the memory 125 and employing these to determine new values. The adjustment may be in accordance with equations (1) and (2) as described above. Step 370 may also include storing in memory 125 an indication of the value of either or both of the adjusted first and second gain factors for use in a subsequent iteration of the method.

After step 370 flow returns to step 300 for a further iteration of the process.

Many variations on the architecture illustrated in FIG. 1 are possible for implementing the disclosure. Possible variations will now be discussed, followed by the presentation of two further embodiments.

In the embodiment of FIG. 1, the energy within the common frequency range of the error signal is estimated from the filtered error signal. This is particularly convenient if the common frequency range is equal to the bandwidth of the loop filter 40, as no additional filtering of the error signal is required before the energy is estimated. Alternatively, the energy may be estimated from the error signal prior to it being filtered by the loop filter 40, although in this case additional filtering is used to select the common frequency range of the error signal in the measurement stage 111. This provides flexibility in the selection of the common frequency range.

Similarly, in the embodiment of FIG. 1, the energy within the common frequency range of the modulation signal is estimated from the low frequency component of the modulation signal. This is particularly convenient if the common frequency range is equal to the bandwidth of the low pass filter 94, as no additional filtering of the modulation signal is required in measurement stage 112 before the energy is estimated. Alternatively, the energy may be estimated from the modulation signal prior to it being filtered by the low pass filter 94, although in this case additional filtering is done in the measurement stage 112 to select the common frequency range of the modulation signal. This provides flexibility in the selection of the common frequency range.

Furthermore, in the embodiment of FIG. 1, the energy within the common frequency range of the modulation signal is estimated from the low frequency component of the modulation signal after scaling by the scaling stage 70. Alternatively the energy may be estimated from the low frequency component of the modulation signal prior to scaling by the scaling stage 70.

Irrespective of which point the modulation signal is extracted from for the purpose of energy estimation, if equations (1) and (2) are employed $E_E$ and $E_L$ should be representative of respectively the estimated energy of the filtered error signal and the estimated energy of the modulation signal in the common frequency range at the input 12 of the oscillator 10. Therefore, if the modulation signal is extracted for energy estimation at a point at which it does not include the scaling present at the input 12, compensatory scaling should be applied by the energy estimation stage 100 or the gain adjustment stage 120. Thus, for example, if the energy estimation is performed on the low frequency component of the modulation signal extracted at output 95, prior to scaling by the scale factor $G_L$ in the scaling stage 70, scaling by a factor $G_L$ should be applied to the energy estimate of the low frequency component, either by the energy estimation stage 110 or the gain adjustment stage 120.

A second embodiment will now be described with reference to FIG. 4. Only the differences between the apparatus 500 and apparatus 200 for generating the modulation components will be described. Blocks which are identical will not be described again, particularly the basic phase-locked loop and the provision for modulation at points 12 and 132. Blocks which perform the same function to those of FIG. 1 are numbered identically, although where the function is implemented in a different manner, the differences will described.

Figure 4:
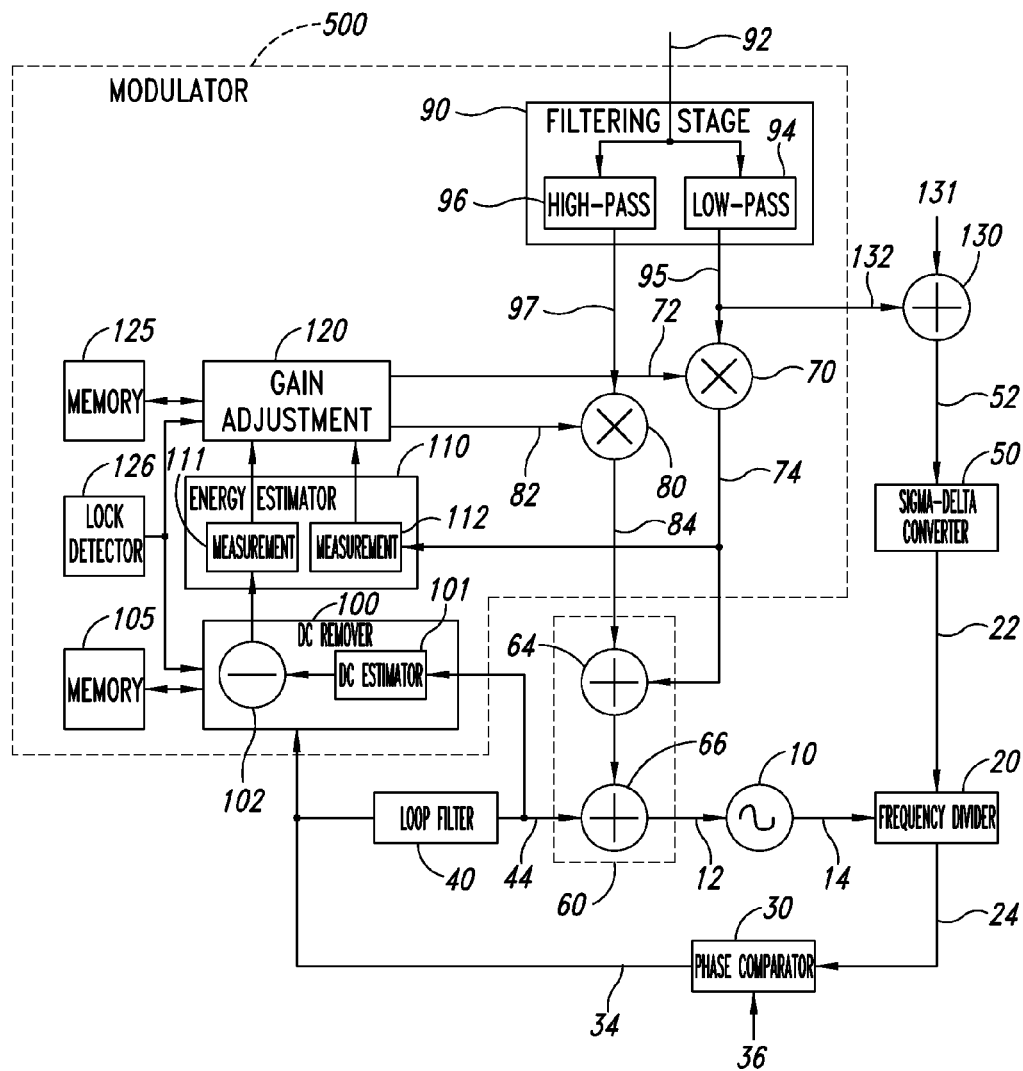
FIG. 4 is a block schematic diagram of another embodiment of a phase locked loop with provision for being modulated.

In FIG. 4 the DC removal stage 100 comprises a DC estimation stage 101 having an input coupled to the output 44 of the loop filter 40, and a subtraction stage 102 having an input coupled to an output of the DC estimation stage 101 and a further input coupled to the output 34 of the phase comparator 30. Thus the subtraction stage 102 is arranged to subtract the DC level estimated by the DC estimation stage 101 at the output of the loop filter 40 from the error signal provided by the phase comparator 30.

An output of the DC removal stage 100 is coupled to the measurement stage 111 of the energy estimation stage 110. The measurement stage 112 is coupled to the input 92 for receiving the modulation signal, instead of the scaled low frequency component as in FIG. 1. Measurement stages 111 and 112 include filtering to define the common frequency range for the energy estimation. Either the energy estimation stage 110, or the gain adjustment means 120 as described below, has provision for taking account of the first gain factor $G_L$ to ensure the correct evaluation of $E_L$.

The operation of the apparatus 500 illustrated in FIG. 4 is identical to the method described with reference to FIG. 3 for the phase locked loop of FIG. 1, apart from the following differences. At step 340 the error signal output by the phase comparator 30 is received, rather than the filtered error signal, and at step 350 the DC component of that error signal is removed by the DC removal stage 100. As above, this step may include retrieving a previously stored indication of DC value from the store 105 and employing that to assist the DC removal. This step may also include storing, in store 105, an indication of the value of the DC component removed for use in subsequent iterations of the method.

At step 360 the energy is estimated within the common frequency range by the energy estimation stage 110, for the modulation signal, rather than the scaled low frequency component, and for the error signal, rather than the filtered error signal, after DC removal, and an indication of this energy provided to the gain adjustment stage 120.

At step 370 the gain adjustment performed by the gain adjustment stage 120 is in accordance with equations (1) and (2), although to determine $E_L$ the estimate of energy provided by the energy estimation stage 110 for the modulation signal must be scaled by the first scale factor $G_L$ so that it is representative of the energy in the common frequency range of the scaled low frequency component provided to the input 12 of the oscillator 10.

A third embodiment will now be described with reference to FIG. 5. Only the differences between the apparatus 600 and apparatus 200 for generating the modulation components will be described. Blocks which are identical will not be described again, particularly the basic phase-locked loop and the provision for modulation at points 12 and 132. Blocks which perform the same function to those of FIG. 1 are numbered identically, although where the function is implemented in a different manner, the differences will described.

Summing of the filtered error signal with the low and high frequency components is performed by summing stage 60C, which contains only a single summer 66, the low and high frequency components being summed within the apparatus 600.

The measurement stage 112 is coupled to the output 95 for receiving the low frequency component, instead of the scaled low frequency component as in FIG. 1. The scale factor applied at input 72 of the scaling stage 70 is not the first gain factor $G_L$ but is the constant k. Therefore the scaling stage 70 in this embodiment may be implemented as a right shift in a binary register. There is a summing stage 140 having inputs coupled to respectively output 97 and output 74. An output 144 of the summing stage 140 is coupled to an input of a scaling stage 150 for scaling the sum of the high frequency component and the low frequency component which has been already scaled by k, by the second scale factor $G_H$. A further input 152 of the scaling stage 150 is coupled to the gain adjustment stage 120 for receiving the second scale factor $G_H$. An output 154 of the scaling stage 150 is coupled to the summer 66 for summing with the filtered error signal.

Figure 5:
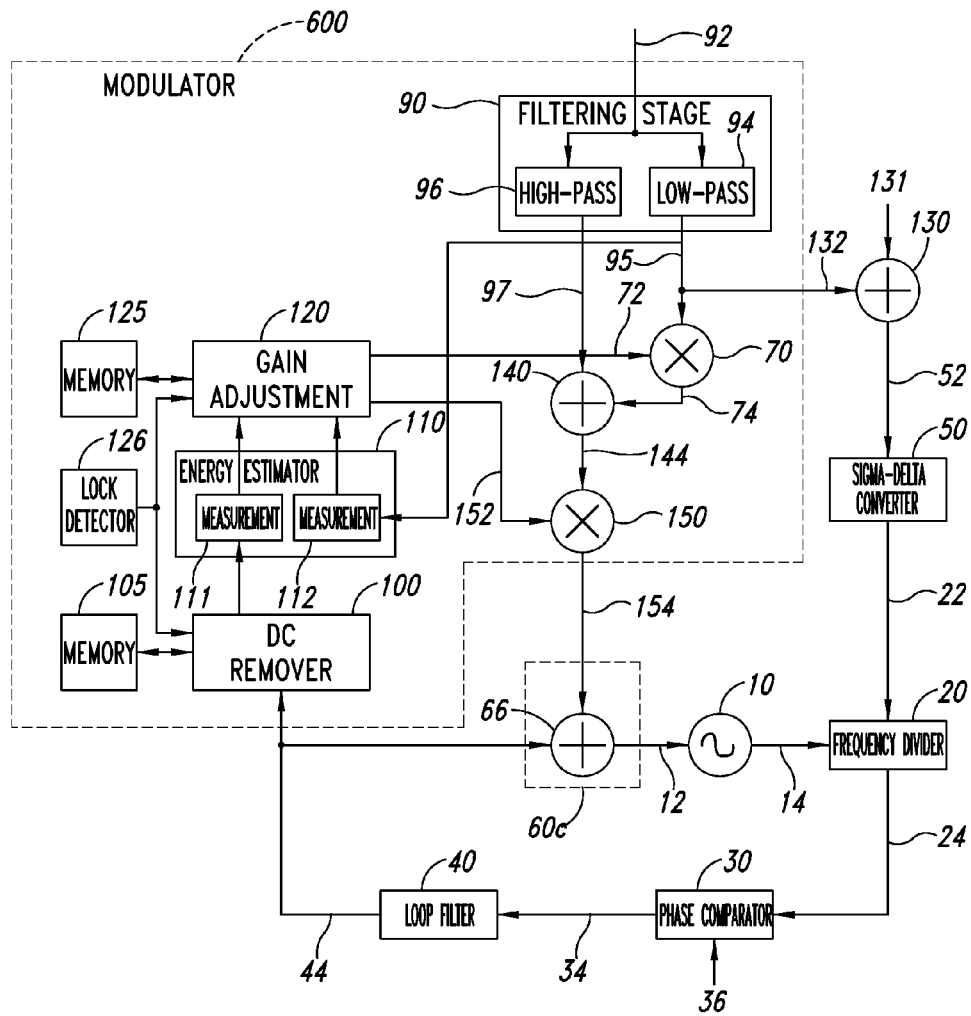
FIG. 5 is a block schematic diagram of further embodiment of a phase locked loop with provision for being modulated.

The operation of the apparatus 600 illustrated in FIG. 5 is identical to the method described with reference to FIG. 3 for the phase locked loop of FIG. 1, apart from the following differences. At step 320, the low frequency component scaled by k, the high frequency component is summed with the low frequency component scaled by k, and the resulting sum is scaled by the second gain factor $G_H$, which may include retrieving the second gain factor from the store 125. Thus the low frequency component is scaled by k·$G_H$, which is $G_L$. At step 360 the energy of the low frequency component, rather than the scaled low frequency component, and the filtered error signal after DC removal, is estimated in the common frequency range by the energy estimation stage 110, and an indication of this energy is provided to the gain adjustment stage 120. As for the embodiment of FIG. 4, in determining $E_L$, either the energy estimation stage 110 or the gain adjustment stage 120 scales the measured energy of the low frequency component, either in step 360 or step 370, to ensure that the value determined for $E_L$ is representative of the energy of the modulation signal in the common frequency range at the input 12 of the oscillator 10.

The features of the three embodiments may be combined, in particular different ways of providing the error signal to the energy estimation stage 100, i.e., pre- or post-filtering by the loop filter 40, may be combined with the different ways of providing a portion of the modulation signal to the energy estimation stage 100, i.e., pre- or post-scaling by $G_L$, and pre- or post filtering by the filtering stage 90. The skilled person will recognize other possibilities, such modifying the scheme of FIG. 5 to providing a portion of the modulation signal to the energy estimation means 110 from output 144, before scaling by the second scale factor $G_H$ or from output 74 in FIG. 5 after scaling by k and before summing with the high frequency component.

Although the common frequency range is equal for both the error signal and the modulation signal, the filtering employed to define the common frequency range may be different for the error signal and for modulation signal, depending on the characteristics of the spectrum of the modulation. For example, if the modulation signal has one or more gaps in its spectrum, for example around DC or around the frequency corresponding to the upper limit of the common frequency range, the evaluation of its energy may exclude the bandwidth of the gaps without affecting the energy estimate, or may include additional bandwidth where the gaps are located without affecting the energy estimate. The error signal has a low pass characteristic and has no gaps in its spectrum.

Some additional details of the apparatus and methods will now be described. The phase locked loop will reject modulation frequencies within the loop bandwidth that are applied only at the second modulation point, input 12. However the system can still work well if these frequencies are applied simultaneously at both modulation points, input 12 and input 132. When these frequencies are applied with unity gain to both inputs 12, 132, the initial modulation induced onto the oscillator is then demodulated by the divider 20 in the feedback path from the oscillator output 14, creating a nominally undisturbed reference signal. The phase comparator 30 output should then contain no modulation frequency components. In practice, any difference in gains between the two modulation paths shows up as a small phase comparator error, which in turn will create a compensating signal at the oscillator input 12, such as to properly create the wanted modulation spectrum. If the gain of the forward path at the oscillator input 12 is too high, the compensating signal will have opposite polarity, and cancels the excess part of the signal at input 12. If the gain of the forward path at the oscillator input 12 is too low, the polarities will be aligned, and the compensating signal will add to the modulation signal at the level that makes up the difference.

The disclosure may be implemented in either wholly or partly in analog or digital domains. For example, the apparatuses 200, 500, 600 for applying modulation may be implemented solely in the digital domain and used in conjunction with an analog phase locked loop. The implementation may comprise, for example, a processor, digital signal processor (DSP), a central processing unit (CPU) or such like. Additionally or alternatively, the implementation may comprise a hard-wired circuit or circuits, such as an application-specific integrated circuit (ASIC), or embedded software. It can also be appreciated that the disclosure can be implemented using computer software or computer program code. The computer software or computer program code can be carried by a computer readable medium. The medium may be a physical storage medium such as a read only memory (ROM) chip. Alternatively, it may be a disk such as a digital versatile disk (DVD-ROM) or compact disk (CD-ROM). It could also be a signal such as an electronic signal over wires, an optical signal or a radio signal such as to a satellite or the like.

Figure 6:
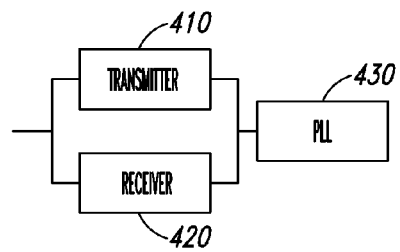
FIG. 6 is a block schematic diagram of a transceiver having a phase locked loop.

The apparatus and phase locked loop in accordance with the disclosure may be employed in a communication transmitter or transceiver. Referring to FIG. 6, there is illustrated a radio communication apparatus comprising a transmitter 410 and a receiver 420 coupled to an antenna, and coupled to a phase locked loop 430 which generates a local oscillator signal. The phase locked loop 430 includes any one of the apparatuses 200 or 500 or 600 for applying modulation to the phase locked loop during transmission.

From reading the present disclosure, other variations and modifications will be apparent to the skilled person. Such variations and modifications may involve equivalent and other features which are already known in the art of phase locked loops and transmitters, and which may be used instead of, or in addition to, features already described herein.

Although the appended claims are directed to particular combinations of features, it should be understood that the scope of the disclosure of the present disclosure also includes any novel feature or any novel combination of features disclosed herein either explicitly or implicitly or any generalization thereof, whether or not it relates to the same disclosure as presently claimed in any claim and whether or not it mitigates any or all of the same technical problems as does the present disclosure.

Features which are described in the context of separate embodiments may also be provided in combination in a single embodiment. Conversely, various features which are, for brevity, described in the context of a single embodiment, may also be provided separately or in any suitable sub-combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfill the functions of several means recited in the claims and reference signs in the claims shall not be construed as limiting the scope of the claims.

The invention claimed is:

1. An apparatus for modulating a phase locked loop that includes a variable frequency oscillator configured to generate an oscillator signal at an oscillator frequency; a variable division ratio divider configured to divide the oscillator signal using a variable division ratio; a phase comparator configured to generate an error signal indicative of a phase difference between the divided oscillator signal and a reference signal; and a coupler configured to control the oscillator frequency by applying, to a control input of the oscillator, a control signal based on the error signal, the apparatus comprising:
    modulation filtering means for providing a low frequency component of a modulation signal and a high frequency component of the modulation signal;
    scaling means for scaling the low frequency component by a first gain factor and the high frequency component by a second gain factor;
    outputs for delivering the low frequency component for controlling the division ratio and the scaled low and scaled high frequency components for controlling the oscillator frequency in combination with the error signal;
    energy estimation means for generating an indication of energy of the modulation signal and the energy of the error signal in a frequency range common to the modulation signal and the error signal; and
    gain adjustment means for modifying the first and second gain factors dependent on the indication of the energy.

2. An apparatus as claimed in claim 1, wherein the phase locked loop has a low-pass loop filter configured to filter the error signal and the energy estimation means includes means for estimating the energy of the error signal in the common frequency range from the filtered error signal.

3. An apparatus as claimed in claim 2, wherein the common frequency range corresponds to a bandwidth of the loop filter.

4. An apparatus as claimed in claim 1, wherein the energy estimation means includes means for estimating the energy of the modulation signal in the common frequency range from the low frequency component of the modulation signal.

5. An apparatus as claimed in claim 1, wherein the energy estimation means includes means for estimating the energy of the modulation signal in the common frequency range from the scaled low frequency component of the modulation signal.

6. An apparatus as claimed in claim 1, wherein the indication of energy comprises an indication of the energy in the common frequency range of the modulation signal and an indication of the energy in the common frequency range of the error signal.

7. An apparatus as claimed in claim 1, wherein the indication of energy comprises an indication of the ratio of the energy of the modulation signal in the common frequency range and the energy of the error signal in the common frequency range.

8. An apparatus as claimed in claim 1, wherein the gain adjustment means includes means for modifying the first and second gain factors by a multiplication factor $$\frac{k}{(1-k)}\frac{E_E}{E_L},$$

where $E_E$ represents the estimated energy of the common frequency range of the error signal, $E_L$ represents the estimated energy of the common frequency range of the modulation signal, $$k = \frac{G_L}{G_H}$$

where $G_L$ is the first gain factor and $G_H$ is the second gain factor, and $k<1$.

9. An apparatus as claimed in claim 8, wherein $E_E$ and $E_L$ are representative of the respective energies at the control input of the oscillator.

10. An apparatus as claimed in claim 1, wherein the second gain factor is $2^n$ times the first gain factor, where n is a positive integer.

11. An apparatus as claimed in claim 1, for use with a plurality of types of modulation signal having different respective spectra, wherein the gain adjustment means includes means for modifying at least one of the first and second gains factors dependent on the type of modulation.

12. An apparatus as claimed in claim 1, comprising DC removal means for removing a DC component from the error signal prior to the energy estimation of the error signal.

13. A device, comprising:
    a phase locked loop that includes:
        a variable frequency oscillator configured to generate an oscillator signal at an oscillator frequency;
        a variable division ratio divider configured to divide the oscillator signal using a variable division ratio;
        a phase comparator configured to generate an error signal indicative of a phase difference between the divided oscillator signal and a reference signal; and
        a coupler configured to control the oscillator frequency by applying, to a control input of the oscillator, a control signal based on the error signal; and a modulator configured to modulate the phase locked loop, the modulator including:
  modulation filtering means for providing a low frequency component of a modulation signal and a high frequency component of the modulation signal;
  scaling means for scaling the low frequency component by a first gain factor and the high frequency component by a second gain factor;
  outputs for delivering the low frequency component for controlling the division ratio and the scaled low and scaled high frequency components for controlling the oscillator frequency in combination with the error signal;
  energy estimation means for generating an indication of energy of the modulation signal and the energy of the error signal in a frequency range common to the modulation signal and the error signal; and
  gain adjustment means for modifying the first and second gain factors dependent on the indication of the energy.

14. A device as claimed in claim 13, wherein the modulator includes lock detection means for generating an out-of-lock indication, and wherein the gain adjustment means includes means for refraining from modifying the first and second gain factors in response to the out-of-lock indication.

15. A device as claimed in claim 13, wherein the modulator includes a memory configured to store an indication of the first and second gain factors and the scaling means includes means for employing the stored values for scaling.

16. A device as claimed in claim 13, wherein the modulator includes a memory configured to store a value of the second gain factor and the scaling means includes means for employing the stored value for scaling.

17. A device as claimed in claim 13, wherein the modulator includes:
  a memory configured to store a value of a DC component of the error signal; and
  a DC removal means for removing the stored value from the error signal.

18. A method, comprising:
  modulating a phase locked loop that includes a variable frequency oscillator configured to generate an oscillator signal at an oscillator frequency, a variable division ratio frequency divider configured to divide the oscillator signal using a variable division ratio, a phase comparator configured to generate an error signal indicative of a phase difference between the divided oscillator signal and a reference signal, the modulating including:
    providing a low and a high frequency component of a modulation signal by filtering the modulation signal;
    scaling the low frequency component by a first gain factor and the high frequency component by a second gain factor;
    controlling the division ratio based on the low frequency component;
    controlling the oscillator frequency based on the scaled low and scaled high frequency components in combination with the error signal;
    generating indications of energy of the modulation signal and energy of the error signal in a frequency range common to the modulation signal and the error signal; and
    modifying the first and second gain factors dependent on the indications of the energy.

19. A method as claimed in claim 18, wherein the phase locked loop comprises a low-pass loop filter configured to filter the error signal, and generating the indication of the energy of the error signal includes generating an indication of energy of the filtered error signal.

20. A method as claimed in claim 19, wherein the common frequency range corresponds to a bandwidth of the loop filter.

21. A method as claimed in claim 18, wherein generating the indication of the energy of the modulation signal includes generating the indication of the energy of the modulation signal from the low frequency component of the modulation signal.

22. A method as claimed in claim 18, wherein generating the indication of the energy of the modulation signal includes generating the indication of the energy of the modulation signal from the scaled low frequency component of the modulation signal.

23. A method as claimed in claim 18, wherein the indication of energy comprises an indication of the energy in the common frequency range of the modulation signal and an indication of the energy in the common frequency range of the error signal.

24. A method as claimed in claim 18, wherein the indication of energy comprises an indication of a ratio of the energy of the modulation signal in the common frequency range and the energy of the error signal in the common frequency range.

25. A method as claimed in claim 18, comprising modifying the first and second gain factors by a multiplication factor $$\frac{k}{(1-k)} \frac{E_E}{E_L}$$

where $E_E$ represents the estimated energy of the common frequency range of the error signal, $E_L$ represents the estimated energy of the common frequency range of the modulation signal, $$k = \frac{G_L}{G_H}$$

where $G_L$ is the first gain factor and $G_H$ is the second gain factor, and $k<1$.

26. A method as claimed in claim 25, wherein $E_E$ and $E_L$ are representative of the respective energies at a control input of the oscillator.

27. A method as claimed in claim 18, wherein the second gain factor is $2^n$ times the first gain factor, where n is a positive integer.

28. A method as claimed in claim 18, comprising modifying at least one of the first and second gains factors in response to different modulation signals having different respective spectra.

29. A method as claimed in claim 18, comprising removing a DC component from the error signal prior to the energy estimation of the error signal.

30. A method as claimed in claim 18, comprising determining whether the phase locked loop is locked and, in response to the phase locked loop being out of lock, refraining from modifying the first and second gain factors.

31. A method as claimed in claim 18, comprising storing an indication of the first and second gain factors and employing the stored values for scaling respectively the low and high frequency components of a subsequent modulation signal.

32. A method as claimed in claim 18, comprising storing an indication of the second gain factor and employing the stored value for scaling the low and high frequency components of a subsequent modulation signal.

33. A method as claimed in claim 18, comprising storing a value of the DC component of the error signal and employing the stored value for subsequent DC removal.

34. A radio communication apparatus, comprising:
   transmitter;
   a phase locked loop coupled to the transmitter and including:
      a variable frequency oscillator configured to generate an oscillator signal at an oscillator frequency;
      a variable division ratio divider configured to divide the oscillator signal using a variable division ratio;
      a phase comparator configured to generate an error signal indicative of a phase difference between the divided oscillator signal and a reference signal; and
      a coupler configured to control the oscillator frequency by applying, to a control input of the oscillator, a control signal based on the error signal; and
   a modulator configured to modulate the phase locked loop, the modulator including:
      modulation filtering means for providing a low frequency component of a modulation signal and a high frequency component of the modulation signal;
      scaling means for scaling the low frequency component by a first gain factor and the high frequency component by a second gain factor;
      outputs for delivering the low frequency component for controlling the division ratio and the scaled low and scaled high frequency components for controlling the oscillator frequency in combination with the error signal;
      energy estimation means for generating an indication of energy of the modulation signal and the energy of the error signal in a frequency range common to the modulation signal and the error signal; and
      gain adjustment means for modifying the first and second gain factors dependent on the indication of the energy.

35. An apparatus as claimed in claim 34, wherein the modulator includes lock detection means for generating an out-of-lock indication, and wherein the gain adjustment means includes means for refraining from modifying the first and second gain factors in response to the out-of-lock indication.

36. A non-transitory computer readable medium having contents that cause a computing device to perform a method comprising:
   modulating a phase locked loop that includes a variable frequency oscillator configured to generate an oscillator signal at an oscillator frequency, a variable division ratio frequency divider configured to divide the oscillator signal using a variable division ratio, a phase comparator configured to generate an error signal indicative of a phase difference between the divided oscillator signal and a reference signal, the modulating including:
      providing a low and a high frequency component of a modulation signal by filtering the modulation signal;
      scaling the low frequency component by a first gain factor and the high frequency component by a second gain factor;
      controlling the division ratio based on the low frequency component;
      controlling the oscillator frequency based on the scaled low and scaled high frequency components in combination with the error signal;
      generating indications of energy of the modulation signal and energy of the error signal in a frequency range common to the modulation signal and the error signal; and
      modifying the first and second gain factors dependent on the indications of the energy.

37. A non-transitory computer readable medium as claimed in claim 36, wherein the method comprises modifying the first and second gain factors by a multiplication factor $$\frac{k}{(1-k)}\frac{E_E}{E_L},$$

where $E_E$ represents the estimated energy of the common frequency range of the error signal, $E_L$ represents the estimated energy of the common frequency range of the modulation signal, $$k = \frac{G_L}{G_H}$$

where $G_L$ is the first gain factor and $G_H$ is the second gain factor, and $k<1$.

* * * * *